United States Patent
Matsuda et al.

(10) Patent No.: US 7,459,992 B2
(45) Date of Patent: Dec. 2, 2008

(54) ACOUSTIC WAVE FILTER AND ACOUSTIC WAVE DUPLEXER

(75) Inventors: Satoru Matsuda, Kawasaki (JP); Shogo Inoue, Kawasaki (JP); Takashi Matsuda, Kawasaki (JP); Masanori Ueda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 287 days.

(21) Appl. No.: 11/438,254

(22) Filed: May 23, 2006

(65) Prior Publication Data
US 2006/0267708 A1   Nov. 30, 2006

(30) Foreign Application Priority Data
May 25, 2005   (JP) ............................. 2005-153006

(51) Int. Cl.
| H03H 9/64 | (2006.01) |
| H03H 9/54 | (2006.01) |
| H03H 9/70 | (2006.01) |
| H03H 9/72 | (2006.01) |

(52) U.S. Cl. ................... 333/133; 333/189; 333/193
(58) Field of Classification Search ............... 333/133, 333/193, 189
See application file for complete search history.

(56) References Cited

U.S. PATENT DOCUMENTS

| 7,034,638 B2 * | 4/2006 | Yamamoto et al. ......... 333/193 |
| 2001/0052830 A1 * | 12/2001 | Noguchi et al. ............. 333/133 |
| 2003/0227358 A1 * | 12/2003 | Inose ........................ 333/193 |
| 2004/0201434 A1 | 10/2004 | Noguchi et al. |

FOREIGN PATENT DOCUMENTS

| JP | 09261002 A | 10/1997 |
| JP | 10-163808 A | 6/1998 |
| JP | 2004-007250 A | 1/2004 |

* cited by examiner

*Primary Examiner*—Barbara Summons
(74) *Attorney, Agent, or Firm*—Arent Fox LLP

(57) ABSTRACT

An acoustic wave filter includes: a ladder filter that has acoustic wave resonators connected in series and parallel arms; an inductor that is provided between a ground and at least one of the parallel-arm resonators in the ladder filter; and a resonance circuit that is provided in parallel with the inductor, and is located between the ground and the parallel-arm resonators in the ladder filter. In this acoustic wave filter, the resonance frequency of the resonance circuit is expressed as:

$$2f0-150 \text{ MHz} < fr < 2f0+150 \text{ MHz}$$

or $$3f0-150 \text{ MHz} < fr < 3f0+150 \text{ MHz},$$

where fr represents the resonance frequency, and f0 represents the passband frequency of the ladder filter.

10 Claims, 15 Drawing Sheets

——— PRIOR ART
----------- COMPARATIVE EXAMPLE

——— PRIOR ART
------- COMPARATIVE EXAMPLE

PRIOR ART
-------- COMPARATIVE EXAMPLE

ACOUSTIC WAVE FILTER AND ACOUSTIC WAVE DUPLEXER

BACKGROUND OF THE INVENTION

1. Field of the Invention

The present invention generally relates to an acoustic wave filter and an acoustic wave duplexer, and more particularly, to an acoustic wave filter including a ladder filter having acoustic wave resonators connected in series and parallel arms, and an acoustic wave duplexer using the acoustic wave filter.

2. Description of the Related Art

As mobile communication systems have developed, portable telephone devices and mobile information terminals have been rapidly spreading these days. For portable telephone devices, high-frequency bands such as the 800 MHz to 1.0 GHz band and the 1.5 GHz to 2.0 GHz band are used. High-frequency filters and antenna duplexers using high-frequency filters are employed in those mobile communication systems.

Examples of high-frequency filters include a ladder filter that has acoustic wave resonators connected in series and parallel arms and functions as a bandpass filter having a predetermined passband. An acoustic wave resonator that can be used in a ladder filter may be a surface acoustic wave (SAW) resonator that is small in quantity and lightweight with an excellent shape factor, or a film bulk acoustic resonator (FBAR) that exhibits excellent characteristics at high frequencies and can be made small in size.

A ladder filter as a bandpass filter is expected to achieve a large stop band attenuation. Japanese Unexamined Patent Publication No. 2004-7250 discloses a technique of increasing the stop band attenuation by connecting inductors to parallel-arm resonators in series (prior art 1). Japanese Unexamined Patent Publication No. 10-163808 discloses a technique of increasing the stop band attenuation by connecting the parallel-arm resonators to one another and connecting an attenuation pole to the parallel-arm resonators in series (prior art 2).

However, in the prior arts, it has been difficult to obtain a desired stop band attenuation in the vicinity of the passband and desired attenuations at high frequencies, simultaneously. For example, the attenuation in the vicinity of the passband is essential to attenuate a reception signal in a transmission filter of an antenna duplexer. Meanwhile, the attenuations at high frequencies are essential to attenuate the second harmonic wave and the third harmonic wave of the transmission frequency.

The attenuation characteristics of the acoustic wave filter of the prior art 1 were calculated. FIGS. 1A and 1B show the circuit structures of the acoustic wave filters used for the calculations. FIG. 1A illustrates the prior art 1, and FIG. 1B illustrates a comparative example. As shown in FIG. 1A, series-arm resonators S1, S2, S3, and S4 are connected in series, and parallel-arm resonators P1 and P2 are connected in parallel, between an input terminal Tin and an output terminal Tout in the prior art 1. With this structure, a ladder filter is formed. Inductors L01 and L02 are series-connected to the parallel-arm resonators P1 and P2, respectively. The inductors L01 and L02 are grounded in the package. The inductances of the inductors L01 and L02 are 1.0 nH and 0.3 nH, respectively, and the passband frequency (f0) of the ladder filter is 824 MHz to 849 MHz.

As shown in FIG. 1B, parallel-arm resonators P1 and P2 of a ladder filter that are the same as those shown in FIG. 1A are connected to each other on a chip, and are series-connected to a common inductor L01. The inductance of the inductor L01 is 1.0 nH, and the passband frequency (f0) is 824 MHz to 849 MHz.

FIGS. 2A and 2B show the attenuations in relation to the frequencies of the filters of the prior art 1 and the comparative example. FIG. 2A shows the attenuations in the vicinity of the passband, and FIG. 2B shows the attenuations at 0 GHz to 3 GHz. In each graph shown in FIGS. 2A and 2B, the prior art 1 is indicated by a solid line, and the comparative example is indicated by a broken line. As shown in FIG. 2B, the prior art 1 exhibits a larger attenuation than the comparative example at frequencies of approximately 1.2 GHz and higher. However, as shown in FIG. 2A, the prior art 1 exhibits a smaller attenuation than the comparative example in the vicinity of the passband of 870 MHz to 960 MHz.

Next, the attenuation characteristics of the acoustic wave filter of the prior art 2 were calculated. FIG. 3 illustrates the circuit structure of the acoustic wave filter used for the calculations. As shown in FIG. 3, parallel-arm resonators P1 and P2 of a ladder filter that are the same as those of the prior art 1 shown in FIG. 1A are connected to each other. A parallel resonance circuit formed with an inductor L01, a capacitor C3, and an inductor L3 is connected to the parallel-arm resonators P1 and P2, and the parallel resonance circuit is grounded. The inductances of the inductors L01 and L3 and the capacitance of the capacitor C3 are 1 nH, 2 nH, and 5 pF, respectively. The passband frequency (f0) is 824 MHz to 849 MHz.

FIGS. 4A and 4B show the attenuations in relation to the frequencies of the filters of the prior art 2 and the comparative example. FIG. 4A shows the attenuations in the vicinity of the passband, and FIG. 4B shows the attenuations at 0 GHz to 3 GHz. In each graph shown in FIGS. 4A and 4B, the prior art 2 is indicated by a solid line, and the comparative example is indicated by a broken line. As shown in FIG. 4A, the prior art 2 exhibits a larger attenuation than the comparative example at 865 MHz to 870 MHz, and, as shown in FIG. 4B, the prior art 2 exhibits a larger attenuation than the comparative example at frequencies of 2.1 GHz and higher. However, as shown in FIG. 4A, the prior art 2 exhibits a smaller attenuation than the comparative example in the vicinity of the passband of 870 MHz to 960 MHz.

As described above, in the prior art 1 and the prior art 2, both a desired stop band attenuation in the vicinity of the passband and a desired attenuation at high frequencies cannot be obtained at the same time. If the attenuation at high frequencies is increased, the attenuation in the vicinity of the passband decreases.

SUMMARY OF THE INVENTION

It is therefore an object of the present invention to provide an acoustic wave filter and an acoustic wave duplexer in which the above disadvantage is eliminated.

A more specific object of the present invention is to provide an acoustic wave filter and an acoustic wave duplexer that can restrict a decrease in attenuation in the vicinity of the passband, and can increase the attenuation at high frequencies.

According to an aspect of the present invention, there is provided an acoustic wave filter including: a ladder filter that has acoustic wave resonators connected in series and parallel arms; an inductor that is provided between a ground and at least one of the parallel-arm resonators in the ladder filter; and a resonance circuit that is provided in parallel with the inductor, and is located between the ground and the parallel-arm resonators in the ladder filter, a resonance frequency of the resonance circuit being expressed as: $2f0-150 \text{ MHz} < fr < 2f0+$ 150 MHz or 3f0 −150 MHz<fr<3f0+150 MHz where fr represents the resonance frequency, and f0 represents the passband frequency of the ladder filter. The resonance circuit may have an attenuation pole at the frequency equivalent to the second harmonic wave or the third harmonic wave of the passband frequency, and is series-connected between a parallel-arm resonator and the ground. The acoustic wave filter thus configured is capable of restricting a decrease in attenuation in the vicinity of the passband and can increase the attenuation at the high frequency equivalent to the second harmonic wave or the third harmonic wave of the passband frequency.

BRIEF DESCRIPTION OF THE DRAWINGS

Other objects, features and advantages of the present invention will become more apparent from the following detailed description when read in conjunction with the accompanying drawings, in which:

FIG. 2A shows the attenuations in the vicinity of the passband; and FIG. 2B shows the attenuations at 0 GHz to 3 GHz;

FIG. 4A shows the attenuations in the vicinity of the passband; and FIG. 4B shows the attenuations at 0 GHz to 3 GHz;

FIG. 8A shows the attenuations in the vicinity of the passband; and FIG. 8B shows the attenuations at 0 GHz to 3 GHz;

DESCRIPTION OF THE PREFERRED EMBODIMENTS

The following is a description of embodiments of the present invention, with reference to the accompanying drawings.

First Embodiment

Figure 5:
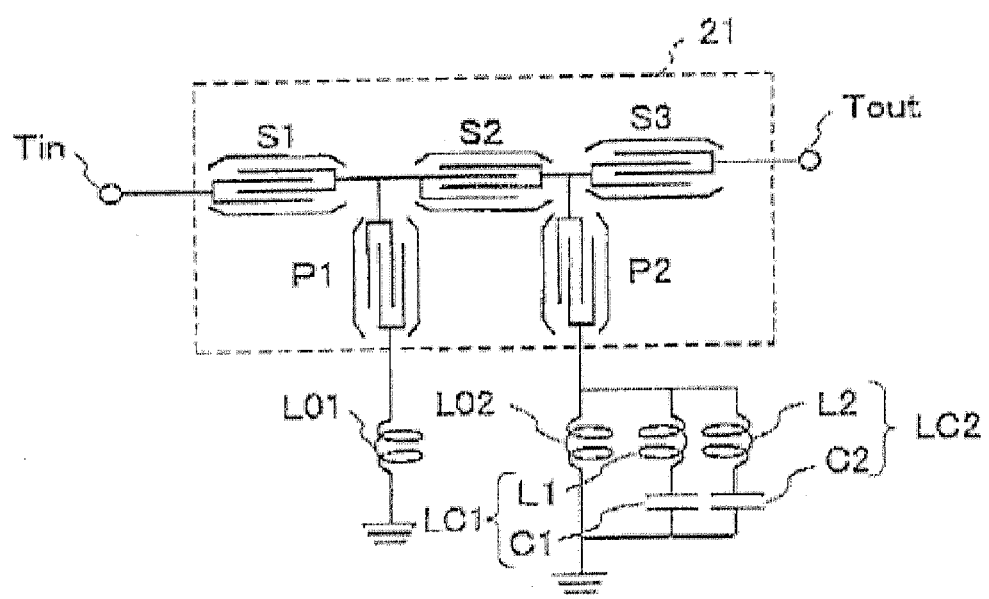
FIG. 5 illustrates the circuit structure of an acoustic wave filter in accordance with a first embodiment of the present invention.
Figure 4A:
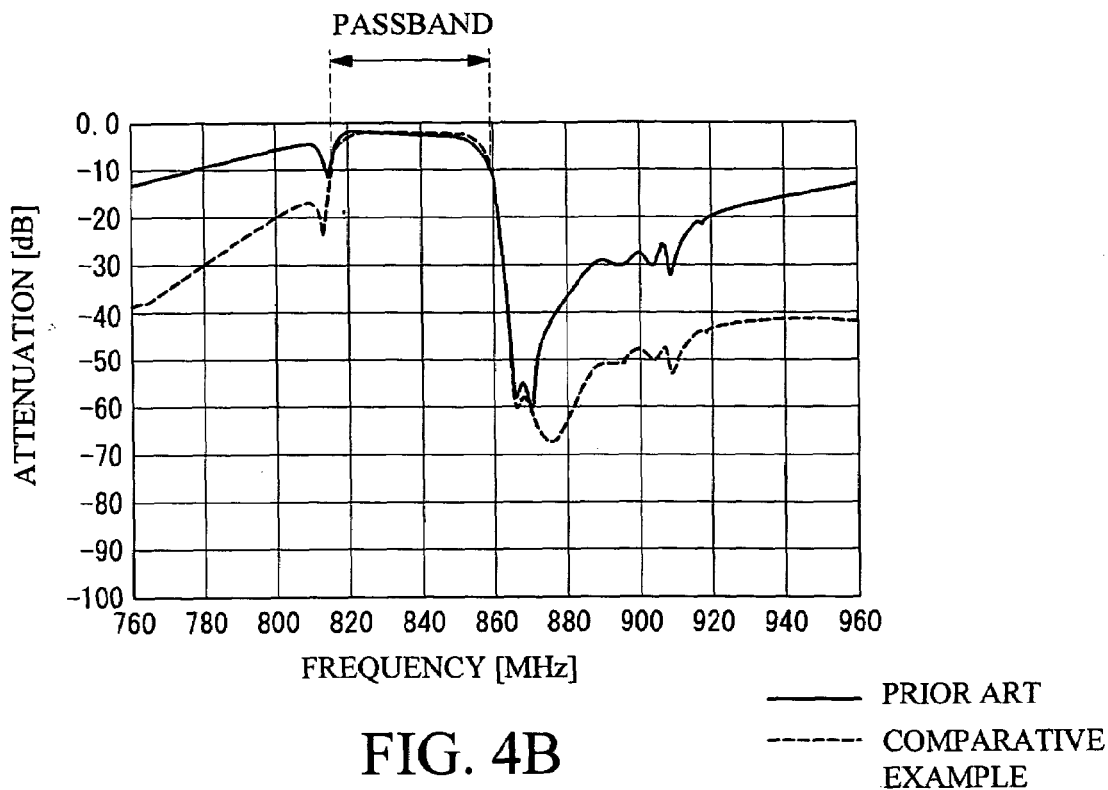
FIGS. 4A and 4B show the attenuations in relation to the frequencies of the acoustic wave filters of the prior art 2 and the comparative example.
Figure 4B:
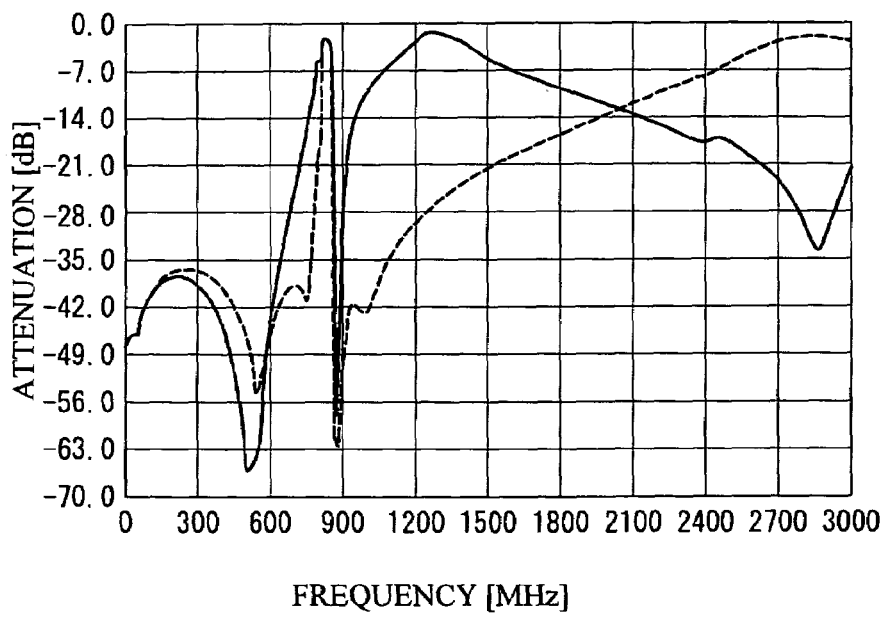

FIG. 5 shows the circuit structure of an acoustic wave filter in accordance with a first embodiment. Series-arm resonators S1, S2, and S3 are connected in series between an input terminal Tin and an output terminal Tout. Parallel-arm resonators P1 and P2 are connected in parallel between the series-arm resonators S1 and S2 and between the series-arm resonators S2 and S3. With this structure, a ladder filter 21 is formed with the resonators S1, S2, S3, P1 and P2. The resonators S1, S2, S3, P1, and P2 are surface acoustic wave resonators.

The parallel-arm resonator P1 is grounded via an inductor L01 of a ground line (or a wire). The parallel-arm resonator P2 is grounded via an inductor L02 of a ground line (or a wire), a series resonator circuit LC1 formed with an inductor L1 and a capacitor C1, and a series resonator circuit LC2 formed with an inductor L2 and a capacitor C2. The inductor L02, the series resonator circuit LC1, and the series resonator circuit LC2 are arranged in parallel. The inductor L02 is provided between the parallel-arm resonator P2 and the ground. The resonator circuits LC1 and LC2 are arranged in parallel with the inductor L02, and are provided between the parallel-arm resonator P2 and the ground.

A ladder filter has a passband frequency (f0) of 824 MHz to 849 MHz. In the resonator circuit LC1, the inductor L1 and the capacitor C1 are 4 nH and 2.5 pF, respectively. In the resonator circuit LC2, the inductor L2 and the capacitor C2 are 1.95 nH and 2 pF, respectively. In a series resonator circuit, an attenuation pole is formed at $1/(2\pi\sqrt{(LC)})$. Accordingly, an attenuation pole is formed at 1693 MHz in the resonator circuit LC, and at 2451 MHz in the resonator circuit LC2. The frequencies of 1693 MHz and 2451 MHz are in the neighborhoods of a second harmonic wave and a third harmonic wave of the passband frequency.

Figure 6:
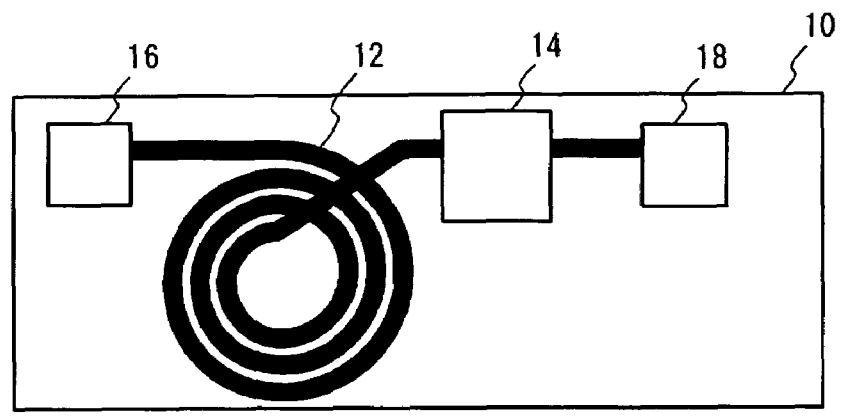
FIG. 6 shows a resonator circuit of the acoustic wave filter in accordance with the first embodiment.

FIG. 6 illustrates the structure of a resonator circuit. Although the two resonator circuits LC1 and LC2 are formed in the first embodiment, only one resonator circuit is shown in FIG. 6. An inductor 12 that is a spiral coil and a MIM capacitor 14 are formed in series between a signal pad 16 and a ground pad 18 on a chip 10. At least either the capacitors C1 and C2 or the inductors L1 and L2 are designed to be of a lumped constant type formed on a chip, so that a high inductance and capacitance can be achieved with high precision. The chip 10 may be a quartz substrate, a glass substrate or a silicon substrate, for example. The pads 16 and 18 and the electrodes of the inductor 12 and the capacitor 14 may be made of aluminum, for example.

Figure 7:
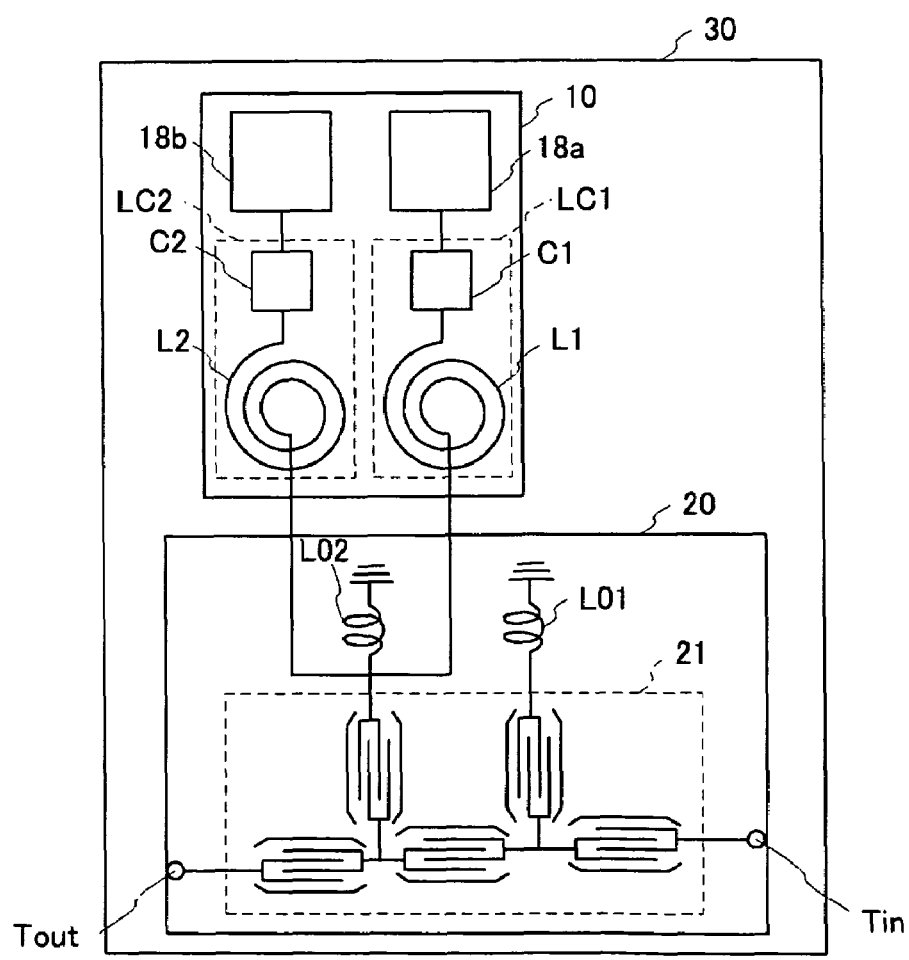
FIG. 7 is a schematic view of the acoustic wave filter in accordance with the first embodiment.

FIG. 7 is a schematic view of a filter in accordance with the first embodiment. A chip 20 having a ladder filter 21 formed thereon and a chip 10 having a resonator circuit formed thereon are mounted onto a package 30. The ladder filter 21 includes surface acoustic wave resonators, and has the same structure as that shown in FIG. 5. A resonator circuit LC1 formed with an inductor L1 and a capacitor C1, and a resonator circuit LC2 formed with an inductor L2 and a capacitor C2 are formed on the chip 10. The inductor L1 of the resonator circuit LC1 and the inductor L2 of the resonator circuit LC2 are connected to a parallel-arm resonator P2 of the ladder filter 21. Ground pads 18a and 18b are connected to the capacitors C1 and C2 of the resonator circuits LC1 and LC2, respectively, so that the capacitors C1 and C2 are grounded.

Figure 1A:
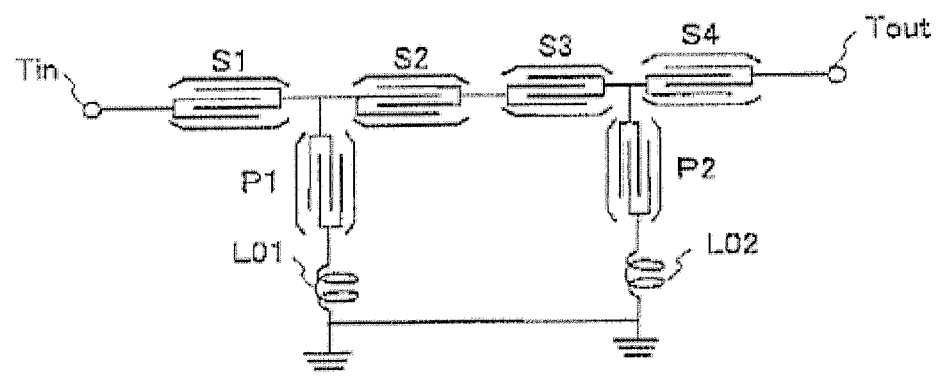
FIG. 1A illustrates the circuit structure of an acoustic wave filter of a prior art 1.
Figure 1B:
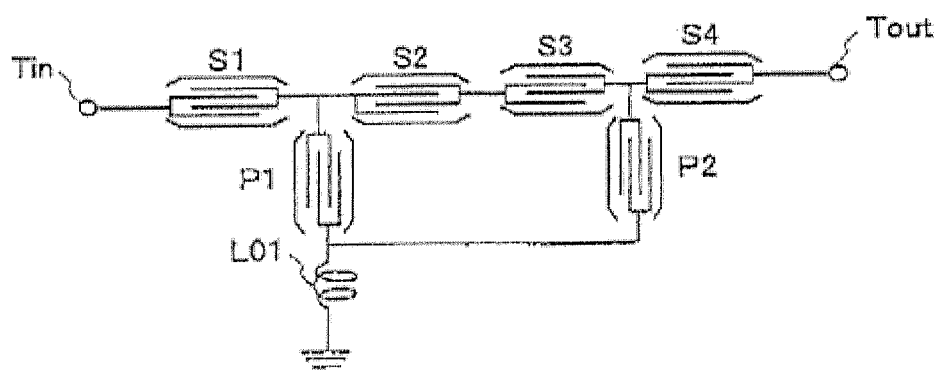
FIG. 1B illustrates the circuit structure of an acoustic wave filter of a comparative example.
Figure 2A:
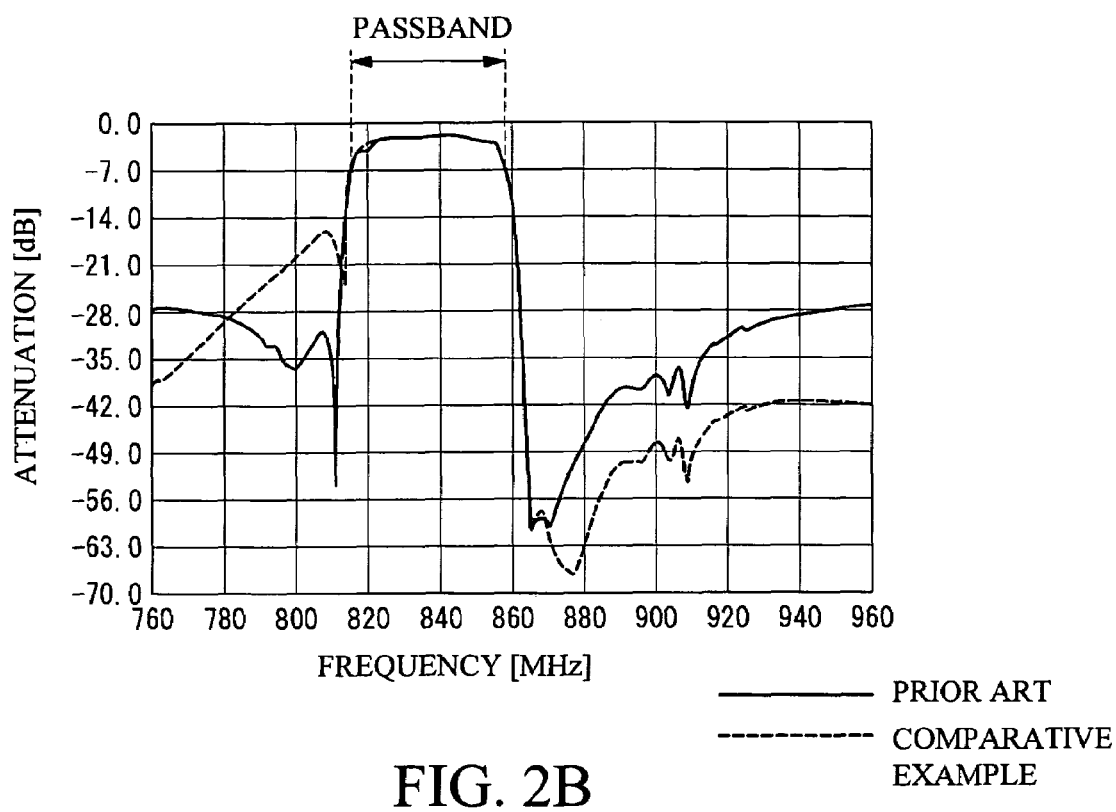
FIGS. 2A and 2B show the attenuations in relation to the frequencies of the acoustic wave filters of the prior art 1 and the comparative example.
Figure 2B:
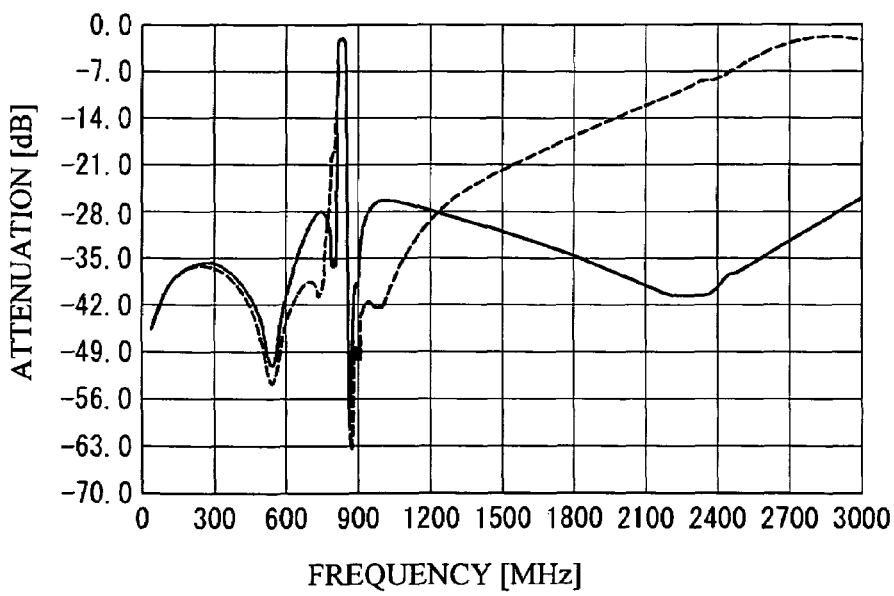
Figure 3:
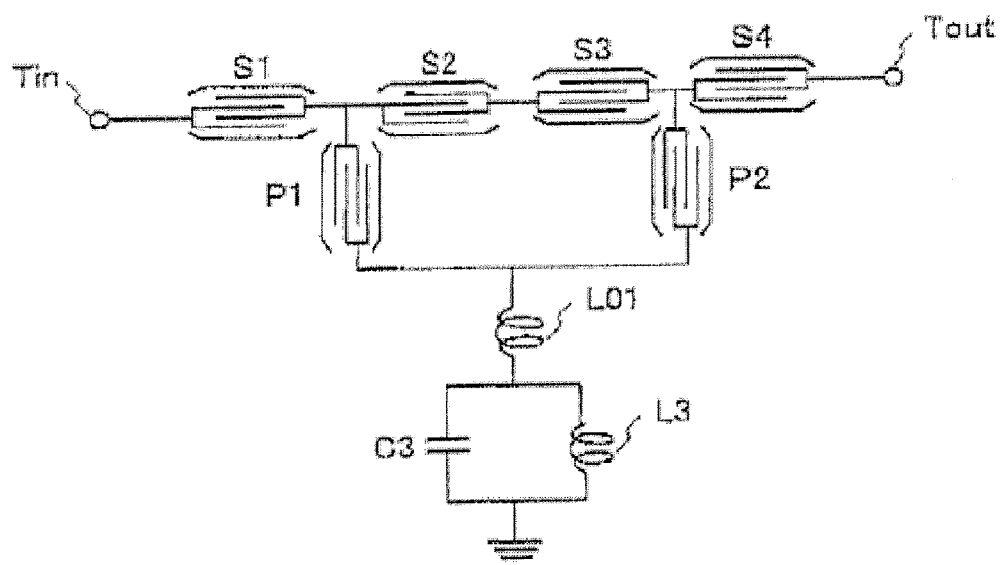
FIG. 3 illustrates the circuit structure of an acoustic wave filter of a prior art 2.
Figure 8A:
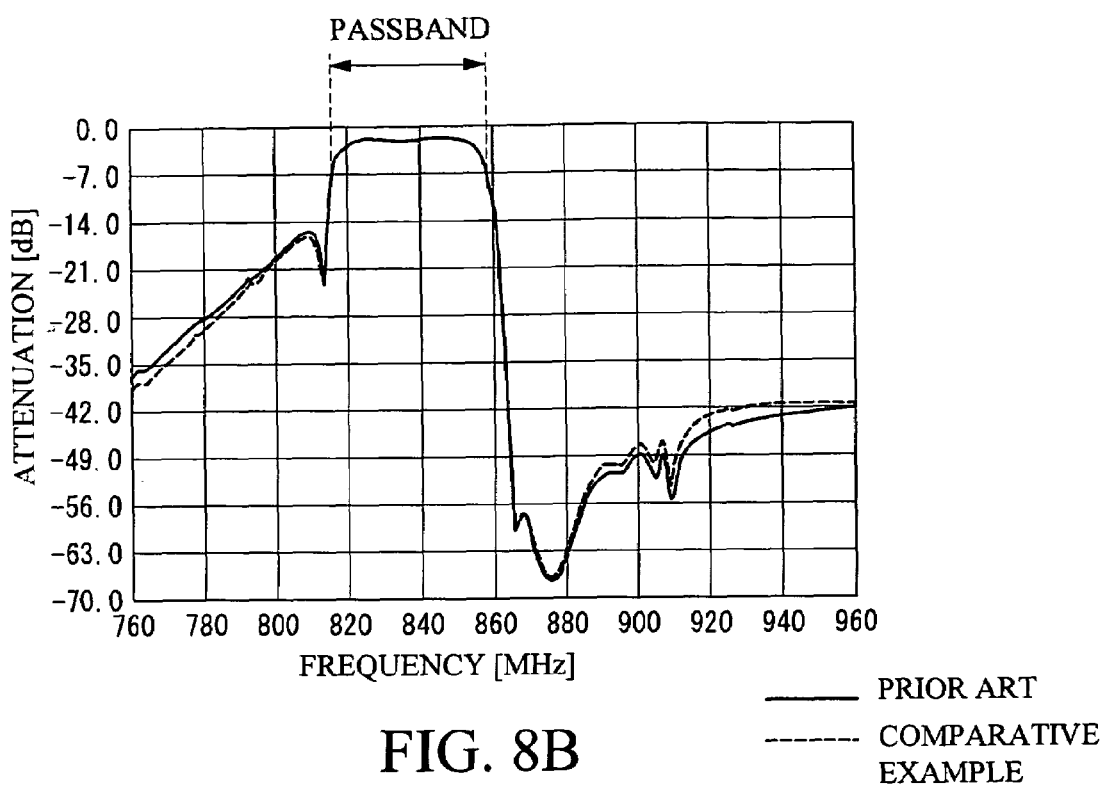
FIGS. 8A and 8B show the attenuations in relation to the frequencies of the acoustic wave filters of the prior art 1 and the comparative example.
Figure 8B:
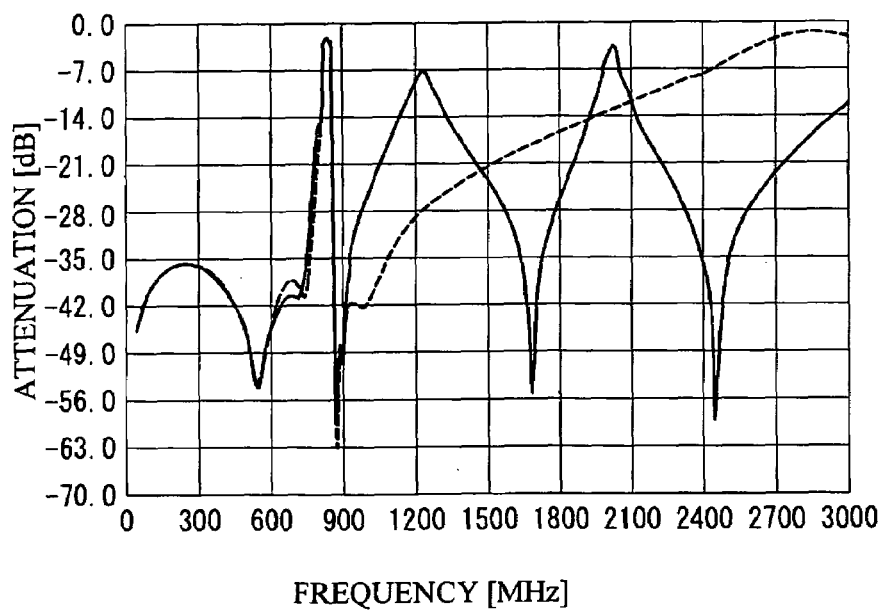

FIGS. 8A and 8B show attenuations in relation to the frequency of an acoustic wave filter of the first embodiment and the frequency of the acoustic filter of the comparative example shown in FIG. 1B. FIG. 8A shows the attenuations in the vicinity of the passband, and FIG. 8B shows the attenuations at 0 GHz to 3 GHz. As shown in FIG. 8A, the first embodiment and the comparative example exhibit substantially the same attenuations at 870 MHz to 960 MHz. This range of frequency matches the frequency range of reception signals where each of the filters is used as a transmission filter of an antenna duplexer. Also, the insertion loss does not increase in the passband. On the other hand, FIG. 8B shows large attenuations at 1693 MHz and 2451 MHz, which correspond to the second harmonic wave and the third harmonic wave of the passband frequency.

As described above, where the filter of the first embodiment is used as a transmission filter of an antenna duplexer, the attenuation in the vicinity of the passband corresponding to reception signals can be prevented from decreasing. Furthermore, the attenuation pole of each resonator circuit is set at two or three times as high as the passband frequency, so that the attenuations at high frequencies corresponding to the second harmonic wave and the third harmonic wave of transmission signals can be increased.

Where the resonance frequency of the resonance circuit LC1 is set as fr and the passband frequency is f0, the attenuation in the vicinity of the second harmonic wave of the passband frequency can be made larger than that of the comparative example by establishing the relationship: 2f0−150 MHz<fr<2f0 +150 MHz. Here, f0 is a range of passband frequencies. Accordingly, where the minimum passband frequency is f0 min and the maximum passband frequency is f0 max, the following relationship is established: 2f0 min−150 MHz <fr<2f0 max+150 MHz.

Likewise, where the resonance frequency of the resonance circuit LC2 is set as fr and the passband frequency is f0, the attenuation in the vicinity of the third harmonic wave can be made larger than that of the comparative example by establishing the relationship: 3f0−150 MHz<fr<3f0+150 MHz. Accordingly, where the minimum passband frequency is f0 min and the maximum passband frequency is f0 max, the following relationship is established: 3f0 min−150 MHz<fr<3f0 max+150 MHz.

To increase the attenuations in the vicinities of the second harmonic wave and the third harmonic wave, it is preferable to establish the relationships: 2f0−100 MHz<fr<2f0+100 MHz and 3f0−100 MHz<fr<3f0+100 MHz. To further increase the attenuations in the vicinities of the second harmonic wave and the third harmonic wave, it is more preferable to establish the relationships: 2f0−50 MHz<fr<2f0+50 MHz and 3f0−50 MHz<fr<3f0+50 MHz.

Also, since the resonance circuits LC1 and LC2 are formed on the same chip 10 in the first embodiment, the mounting area can be reduced.

Second Embodiment

Figure 9:
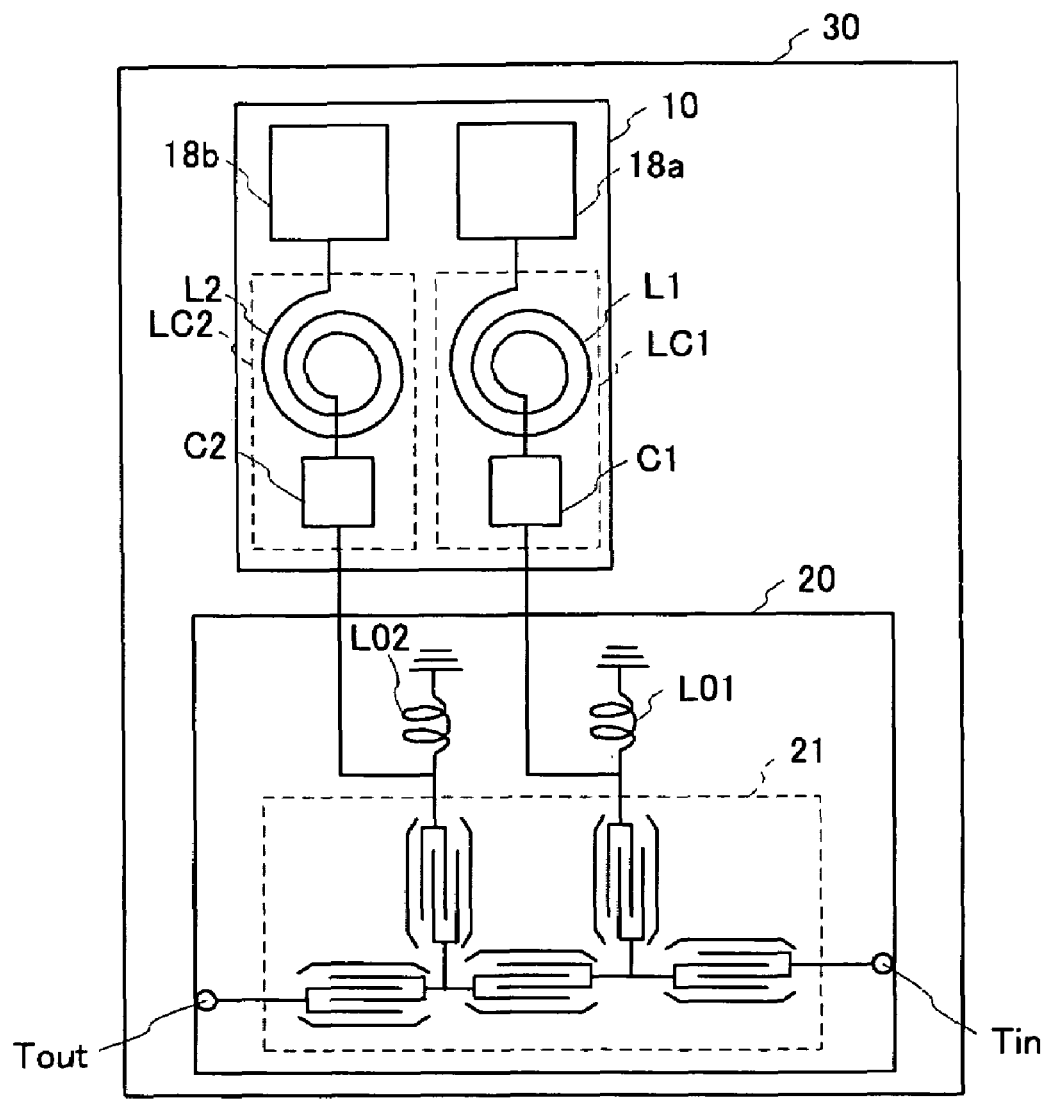
FIG. 9 is a schematic view of an acoustic wave filter in accordance with a second embodiment of the present invention.

A second embodiment of the present invention is a structure in which a series resonance circuit is connected to each of the parallel-arm resonators P1 and P2. FIG. 9 is a schematic view of an acoustic wave filter in accordance with the second embodiment. The second embodiment differs from the first embodiment in that the resonance circuits LC1 and LC2 are connected to the parallel-arm resonators P1 and P2, respectively, and the locations of the inductor L1 and the capacitor C1 are reversed. In this structure, the capacitor C1 is connected to the parallel-arm resonator P1, and the inductor L1 is connected to the ground pad 18a. The inductor L2 and the capacitor C2 are arranged in the same manner as the inductor L1 and capacitor C1. The other aspects of the structure are the same as those of the first embodiment, and therefore, explanation of them is omitted herein. The inductances of the inductors L1 and L2, and the capacitances of the capacitors C1 and C2 are also the same as those in the first embodiment.

Figure 10A:
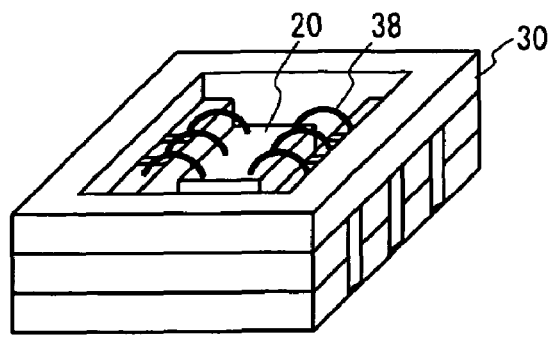
FIG. 10A is a perspective view of a packaged acoustic wave filter in accordance with the second embodiment (the cap is not shown)
Figure 10B:
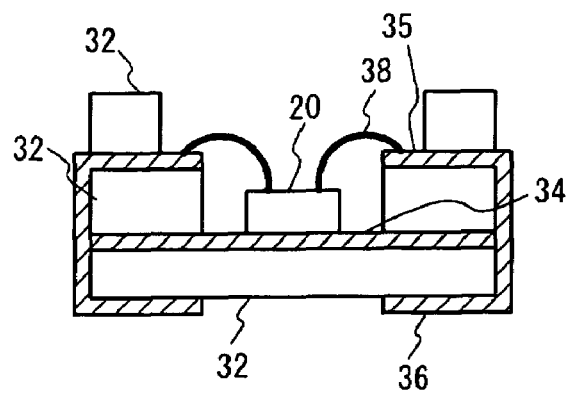
FIG. 10B is a cross-sectional view of the ground extension part of the packaged acoustic wave filter.
Figure 10C:
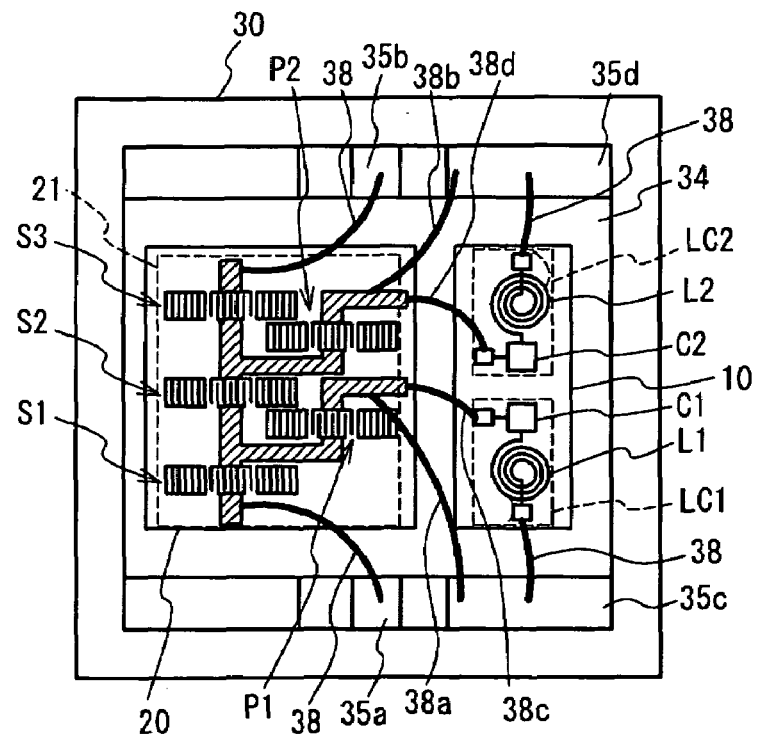
FIG. 10C is a top view of the packaged acoustic wave filter.

FIGS. 10A through 10C illustrate an acoustic wave filter of the second embodiment mounted onto a package 30 (a cap is not shown). FIG. 10A is a perspective view of the acoustic wave filter (the chip 10 is not shown), FIG. 10B is a cross-sectional view of the ground extension part, and FIG. 10C is a top view of the acoustic wave filter. As shown in FIG. 10A, a chip 20 is mounted onto the package 30, and the chip 20 and the package 30 are connected with wires 38. As shown in FIG. 10B, the package 30 is formed with ceramic parts 32, and the wires 38 are wire-bonded to wire bonding parts 35. The chip 20 is die-bonded to a die-attach part 34, and is grounded through connection to the outside via a ground line 36.

As shown in FIG. 10C, the resonators S1, S2, S3, P1, and P2 constitute the ladder filter 21. The chip 20 having the ladder filter 21 formed thereon and the chip 10 having the resonator circuits LC1 and LC2 formed thereon are die-bonded onto the die-attach part 34 of the package 30. The series-arm resonator S1 is connected to a wire pad part 35a with a wire 38, and is connected to an input terminal. The series-arm resonator S3 is connected to a wire pad part 35b with a wire 38, and is connected to an output terminal. The parallel-arm resonators P1 and P2 are connected to wire bonding parts 35c and 35d with wires 38a and 38b, respectively, and are thus grounded. The wires 38a and 38b are equivalent to the inductors L01 and L02 shown in FIG. 9. The parallel-arm resonators P1 and P2 are further connected to the capacitors C1 and C2 of the resonance circuits LC1 and LC2 with wires 38c and 38d. The inductors L1 and L2 of the resonance circuits LC1 and LC2 are connected to the wire bonding parts 35c and 35d with wires 38, and are thus grounded.

As in the second embodiment, the resonance circuit LC1 corresponding to the second harmonic wave and the resonance circuit LC2 corresponding to the third harmonic wave can be connected to the parallel-arm resonators P1 and P2, respectively. Also as in the second embodiment, the locations of the inductor L1 and the capacitor C1 can be the reverse of those of the first embodiment. In any of these cases, the same effects as those of the first embodiment can be achieved.

In a case where attenuation is expected with either the second harmonic wave or the third harmonic wave of the passband frequency, only one resonance circuit of the frequency corresponding to either the second harmonic wave or the third harmonic wave of the passband frequency may be provided. In such a case, attenuation is achieved only in the vicinity of the frequency corresponding to either the second harmonic wave or the third harmonic wave. However, the mounting area can be made smaller.

In a case of a ladder filter having three or more parallel arms, the same effects as above can be achieved by providing at least one of the resonance circuits corresponding to the second harmonic wave and the third harmonic wave between the ground and at least one of the parallel-arm resonators.

Third Embodiment

Figure 11:
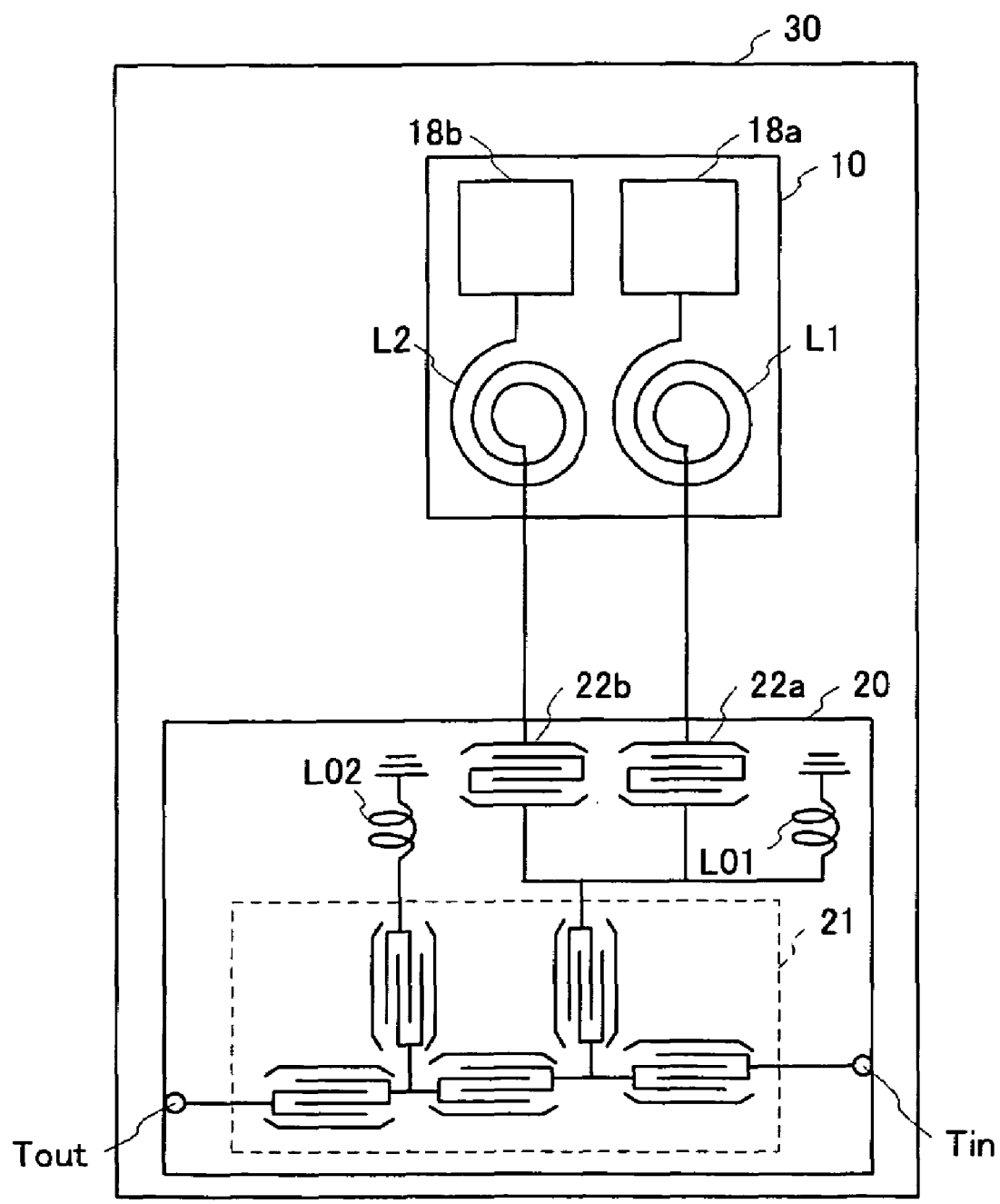
FIG. 11 is a schematic view of an acoustic wave filter in accordance with a third embodiment of the present invention.

A third embodiment of the present invention is a structure in which the capacitors of resonance circuits are acoustic wave resonators. FIG. 11 illustrates the structure of an acoustic wave filter in accordance with the third embodiment. The third embodiment differs from the second embodiment in that acoustic wave resonators 22a and 22b are employed in place of the capacitors C1 and C2 of the resonance circuits LC1 and LC2. Also, the resonance circuits LC1 and LC2 are connected to the parallel-arm resonator P1 in the third embodiment. The other aspects of the structure are the same as those of the second embodiment, and therefore, explanation of them is omitted herein. The capacitances of the acoustic wave resonators 22a and 22b are the same as those of the capacitors C1 and C2 of the first embodiment. Also, the inductances of the inductors L1 and L2 are the same as those in the first embodiment.

Figure 12:
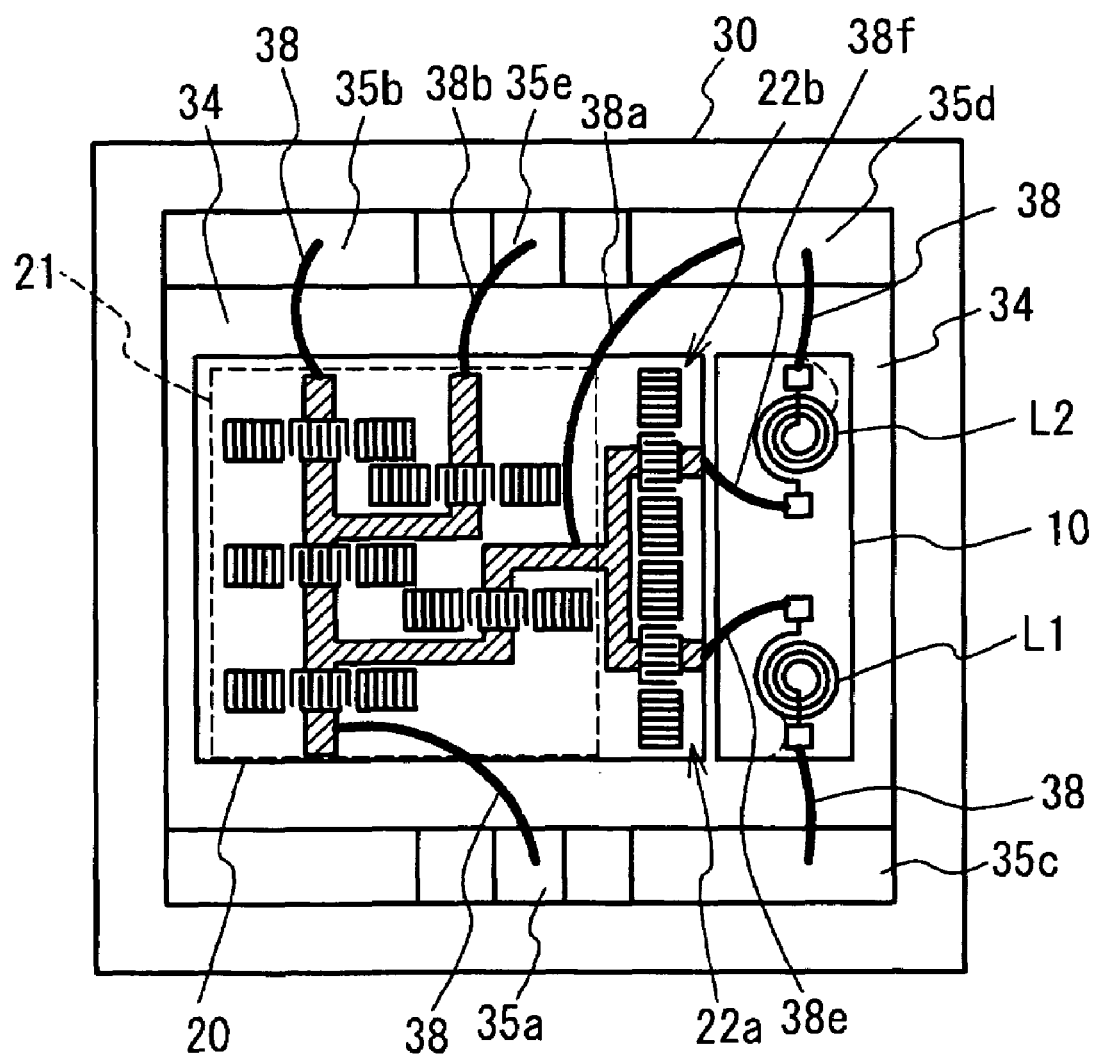
FIG. 12 is a top view of the acoustic wave filter mounted in a package in accordance with the third embodiment (the cap is not shown)

FIG. 12 is a top view of an acoustic wave filter of the third embodiment mounted in a package (the cap is not shown). The acoustic wave resonators 22a and 22b connected to the parallel-arm resonator P1 are formed on a chip 20 having a ladder filter 21 formed thereon. Inductors L1 and L2 are formed on the chip 10. A series-arm resonator S1 is connected to a wire bonding part 35a with a wire 38, and is thus connected to an input terminal. A series-arm resonator S3 is connected to a wire bonding part 35b with a wire 38, and is thus connected to an output terminal. Parallel-arm resonators P1 and P2 are connected to wire bonding parts 35d and 35e with wires 38a and 38b, and are thus grounded. The wires 38a and 38b are equivalent to L01 and L02 shown in FIG. 11. The parallel-arm resonators P1 and P2 are further connected to the inductors L1 and L2 of the resonance circuits with wires 38c and 38d. The inductors L1 and L2 of the resonance circuits are connected to wire bonding parts 35c and 35d, and are thus grounded.

In the case where the acoustic wave resonators 22a and 22b formed on the chip 20 having the ladder filter 21 formed thereon are used as the capacitors of the resonance circuits LC1 and LC2 as in the third embodiment, the same effects as those of the first and second embodiments can be achieved.

Fourth Embodiment

Figure 13:
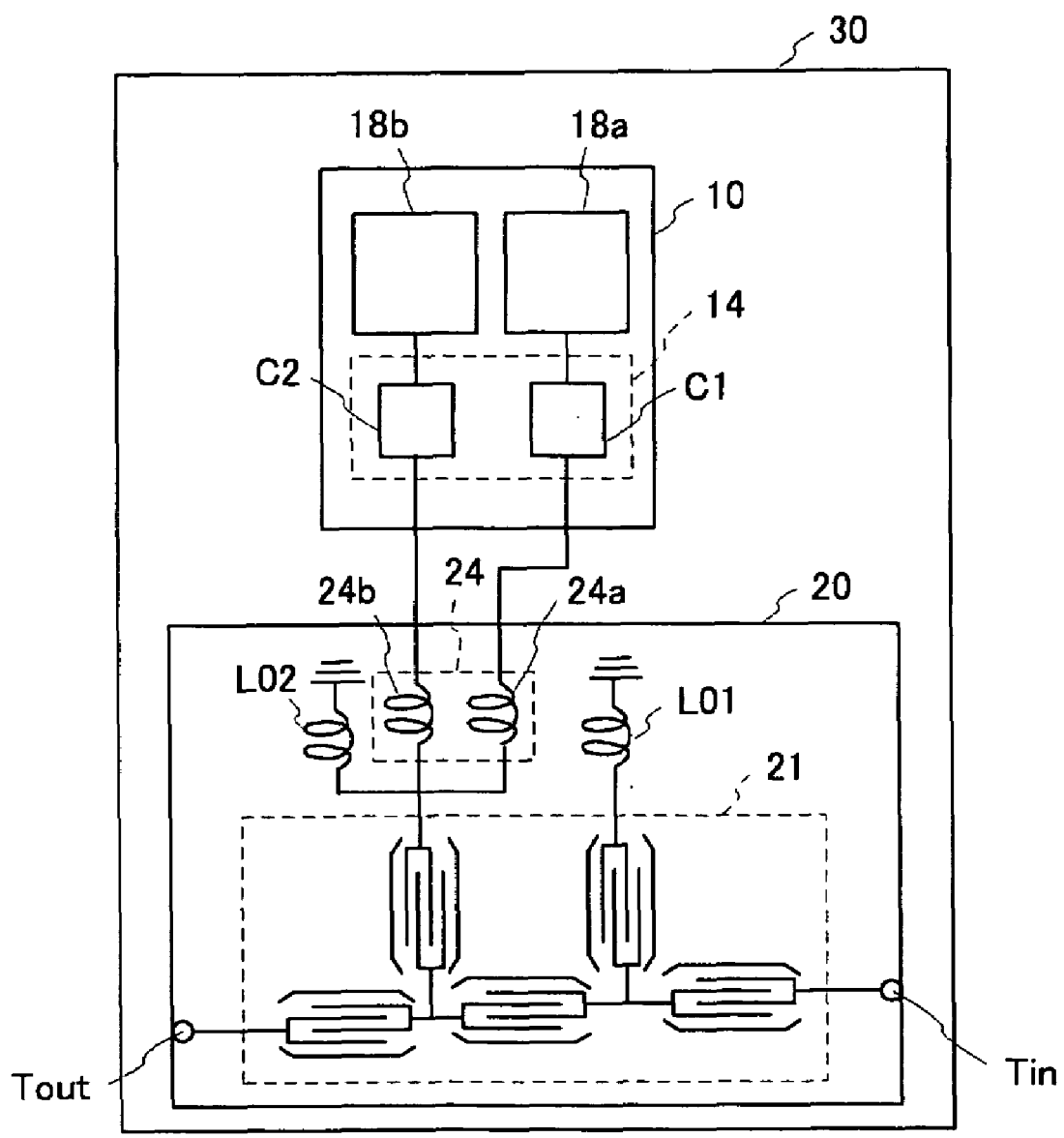
FIG. 13 is a schematic view of an acoustic wave filter in accordance with a fourth embodiment of the present invention.

A fourth embodiment of the present invention is a structure in which ground line patterns are used as the inductors of the resonance circuits. FIG. 13 illustrates the structure of an acoustic wave filter in accordance with the fourth embodiment. The fourth embodiment differs from the first embodiment in that ground line patterns 24a and 24b formed on a chip 20 are used in place of the inductors L1 and L2 of the resonance circuits. Also, the chip 20 is face-down mounted onto a package 30 with bumps 39. The other aspects of the structure are the same as those of the first embodiment, and therefore, explanation of them is omitted herein. The inductances of the ground line patterns 24a and 24b are the same as those of the inductors L1 and L2 of the first embodiment. The capacitances of the capacitors C1 and C2 are also the same as those in the first embodiment.

Figure 14A:
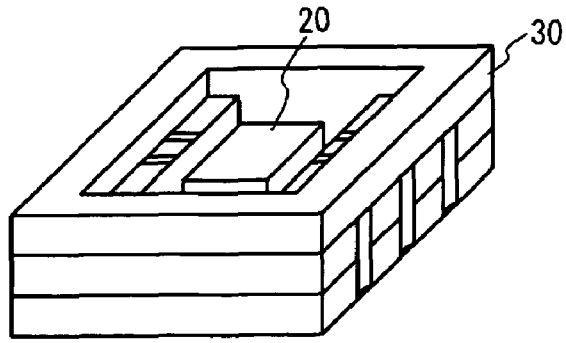
FIG. 14A is a perspective view of the acoustic wave filter mounted in a package in accordance with the fourth embodiment (the cap is not shown)
Figure 14B:
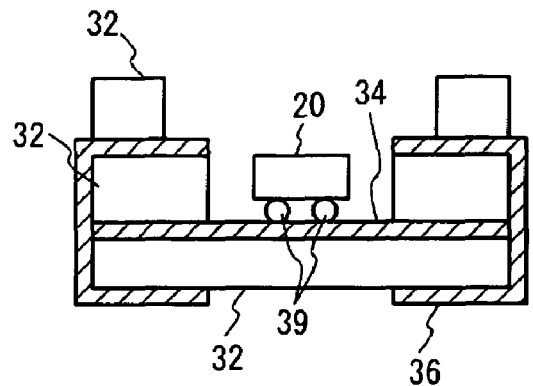
FIG. 14B is a cross-sectional view of the ground extension part of the packaged acoustic wave filter.
Figure 14C:
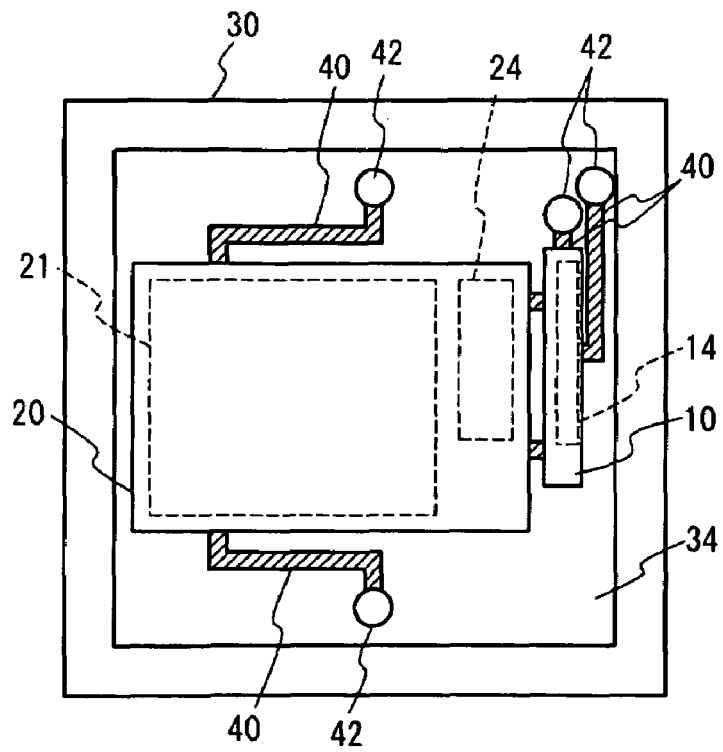
FIG. 14C is a top view of the packaged acoustic wave filter.

FIGS. 14A through 14C illustrate an acoustic wave filter of the fourth embodiment mounted in a package (the cap is not shown). FIG. 14A is a perspective view of the acoustic wave filter, FIG. 14B is a cross-sectional view of the ground extension part, and FIG. 14C is a top view of the acoustic wave filter. As shown in FIGS. 14A and 14B, the chip 10 and the chip 20 are face-down mounted onto the package 30 with the bumps 39. The ladder filter 21 and an inductor unit 24 that includes inductors 24a and 24b are provided on the chip 20. A capacitor unit 14 that includes the capacitors C1 and C2 is provided on the chip 10. Since those units are formed on the side of the die-attach part 34 of the chips 10 and 20, they are indicated by broken lines in FIG. 14C.

The terminals on the chip surface are connected to lines 40 formed on the die-attach part 34 via the bumps 39. Each of the lines 40 is connected to an input/output terminal or the ground with a via 42 on the die-attach part 34.

In the case where the ground line patterns 24a and 24b formed on the chip 20 having the acoustic wave resonators of the ladder filter formed thereon are used as the inductors of the resonator circuits as in the fourth embodiment, the same effects as those of the first, second, and third embodiments can be achieved.

As described above, in the case where the chips are mounted onto the package 30 with the bumps 39 (face-down mounting) as in the fourth embodiment, the same effects can be achieved as those achieved in the case where the chips are mounted onto the package by wire bonding (face-up mounting) as in the first through third embodiments.

Fifth Embodiment

Figure 15:
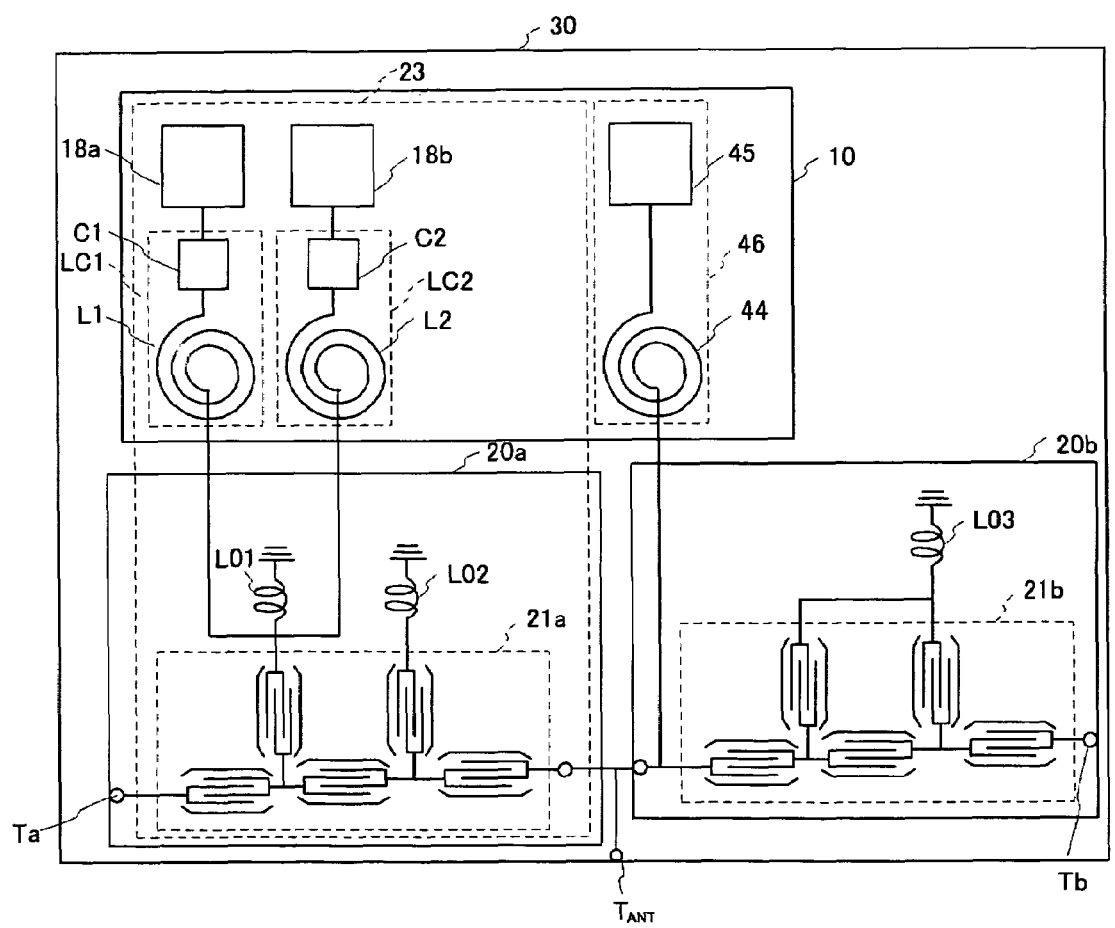
FIG. 15 is a schematic view of an acoustic wave duplexer in accordance with a fifth embodiment of the present invention.

A fifth embodiment of the present invention is an example of an acoustic wave duplexer that is an antenna duplexer, using the acoustic wave filter of the first embodiment as a transmission filter. FIG. 15 illustrates the structure of an acoustic wave duplexer in accordance with the fifth embodiment. A ladder filter 21a is connected to a transmission terminal Ta and an antenna terminal $T_{ANT}$. A resonance circuit LC1 formed with an inductor L1 and a capacitor C1, and a resonance circuit LC2 formed with an inductor L2 and a capacitor C2 are provided between the parallel-arm resonators of the ladder filter 21a and ground pads 18a and 18b. In this manner, the acoustic wave filter of the first embodiment is connected as a transmission filter 23 between the transmission terminal Ta and the antenna terminal $T_{ANT}$. A reception filter 21b that is a ladder filter is connected between the antenna terminal $T_{ANT}$ and a reception terminal Tb. A matching circuit 46 using a reactance circuit formed with an inductor 44 and a ground pad 45 is provided between the antenna terminal $T_{ANT}$ and the reception filter 21b.

Figure 16:
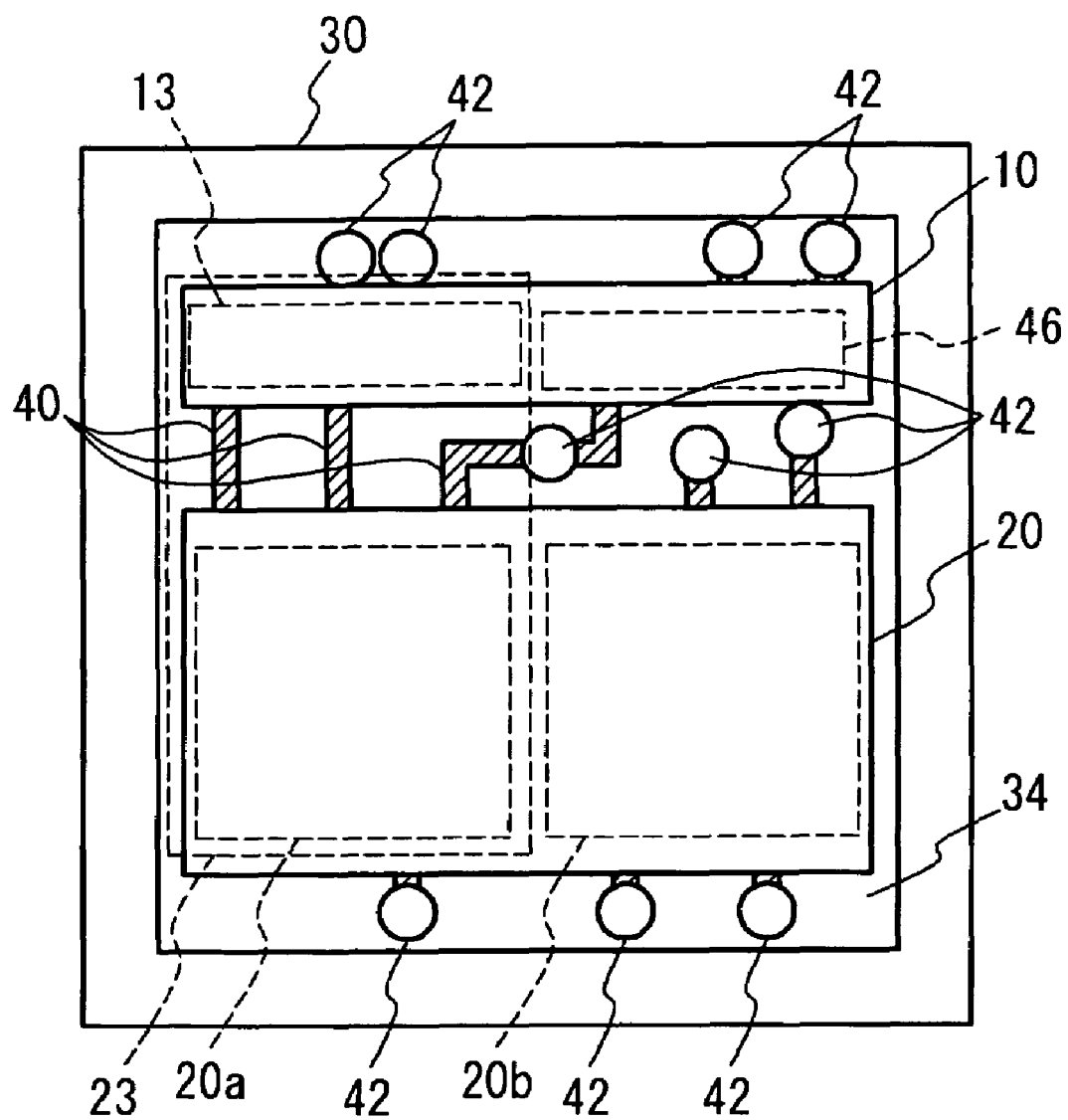
FIG. 16 is a top view of the acoustic wave duplexer mounted in a package in accordance with the fifth embodiment (the cap is not shown)

The ladder filters 21a and 21b are formed on chips 20a and 20b, respectively. Although the chips 20a and 20b are separate chips in FIG. 15, a single chip 20 is used in practice, as shown in FIG. 16. However, it is possible to use separate chips as shown in FIG. 15. The matching circuit 46 is formed on the chip 10 on which the resonance circuits LC1 and LC2 are formed.

FIG. 16 is a top view of the acoustic wave duplexer of the fifth embodiment mounted in a package (the cap is not shown). The chip 20 and the chip 10 are face-down mounted in the package 30 with bumps 39. The ladder filters 21a and 21b are formed on the chip 20. A resonance circuit 13 formed with the resonance circuits LC1 and LC2, and the matching circuit 46 are formed on the chip 10. Since those components are formed on the side of the die-attach part 34 of the chip 20, they are shown by broken lines in FIG. 16. The terminals on the chip surface are connected to lines 40 formed on the die-attach part 34 with bumps. The lines 40 are connected to the transmission terminal Ta, the reception terminal Tb, the antenna terminal $T_{ANT}$, and the ground, with vias formed on the die-attach part 34.

In the acoustic wave duplexer in accordance with the fifth embodiment, the acoustic wave filter of the first embodiment is employed as the transmission filter 23. Accordingly, the attenuation does not decrease in the frequency band of reception signals, and the attenuations can be increased with the second harmonic wave and the third harmonic wave of transmission signals.

In the fifth embodiment, the matching circuit 46 using a reactance circuit is formed on the chip on which the resonance circuits LC1 and LC2 of the transmission filter 23 are formed. In this manner, the mounting area can be reduced. Also, the matching circuit 46 is also formed on the chip on which at least either the inductors L1 and L2 or the capacitors C1 and C2 of the resonance circuits L1 and LC2 are formed. Accordingly, the mounting area can be made smaller.

Figure 17:
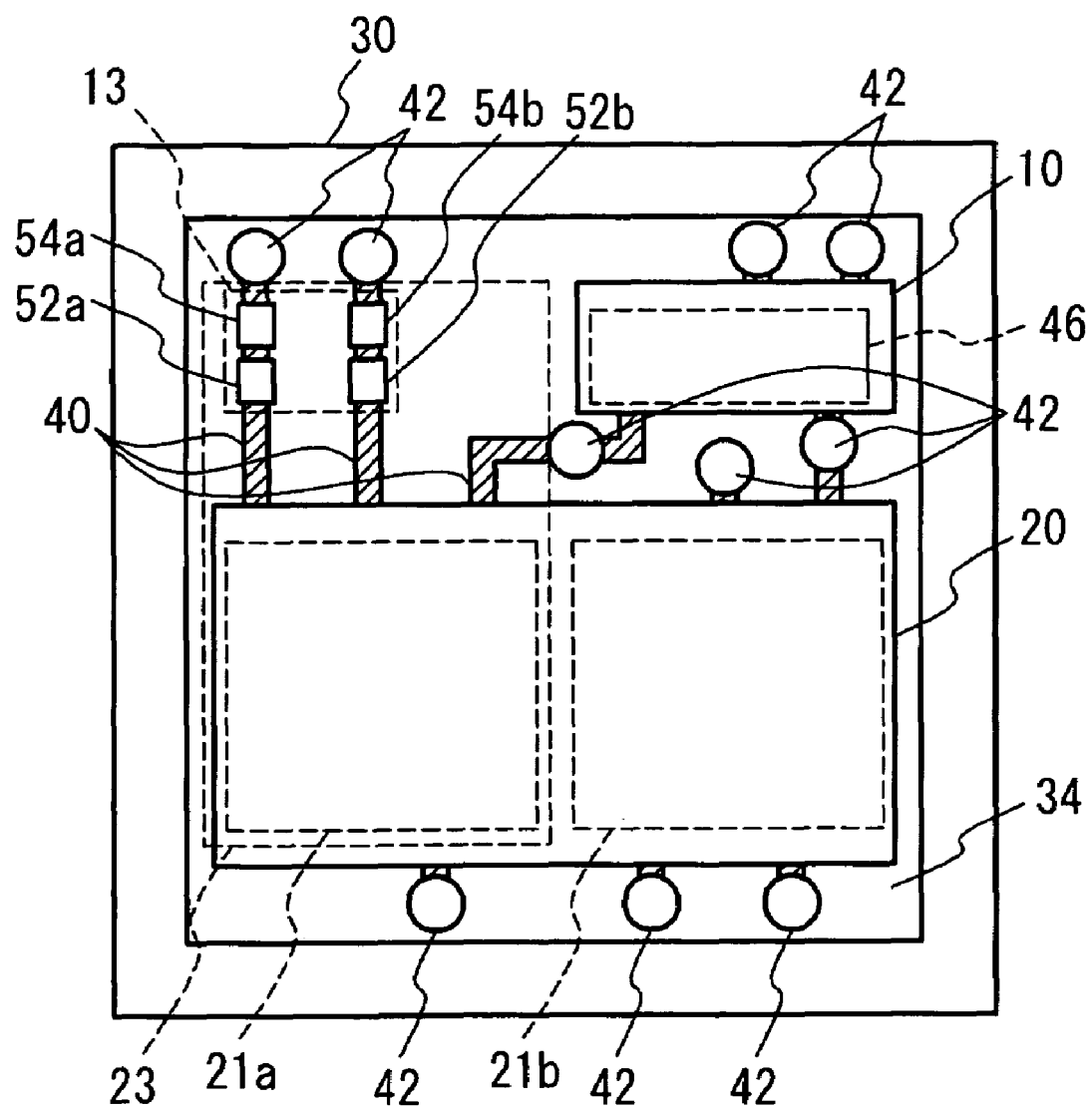
FIG. 17 is a top view of an acoustic wave duplexer mounted in a package in accordance with a modification of the fifth embodiment (the cap is not shown).

FIG. 17 is a top view of an acoustic wave filter mounted in a package in accordance with a modification of the fifth embodiment (the cap is not shown). In this modification, a resonance circuit 13 is formed by mounting individual inductors 54a and 54b and individual capacitors 52a and 52b on a die-attach part 34. The other aspects of the structure are the same as those of the fifth embodiment.

In any of the first through fourth embodiments, at least either the capacitors 52a and 52b or the inductors 54a and 54b of the resonance circuits LC1 and LC2 may be individual components as in the modification of the fifth embodiment. In this case, the same effects as those of the first through fourth embodiments can be achieved.

In the fifth embodiment and its modification, the matching circuit 46 is provided between the antenna terminal $T_{ANT}$ and the reception filter 21b. However, it is possible to provide the matching circuit 46 between the antenna terminal $T_{ANT}$ and the transmission filter 23 or between the antenna terminal $T_{ANT}$ and both the transmission filter 23 and the reception filter 21b.

Although an acoustic wave filter in accordance with the present invention is employed as the transmission filter 23, the reception filter 21b may also be an acoustic wave filter in accordance with the present invention. However, attenuation of the second harmonic wave or the third harmonic wave is required especially on the transmission side. Therefore, it is preferable to employ an acoustic wave filter of the present invention only for the transmission filter 23, so as to reduce the mounting area as in the fifth embodiment and its modification.

Although the first through fifth embodiments involve acoustic wave filters using surface acoustic wave resonators, the same effects as above can be achieved with an acoustic wave filter using film bulk acoustic resonators.

Finally, the various aspects of the present invention mentioned above are summarized as follows.

According to an aspect of the present invention, there is provided an acoustic wave filter including: a ladder filter that has acoustic wave resonators connected in series and parallel arms; an inductor that is provided between a ground and at least one of the parallel-arm resonators in the ladder filter; and a resonance circuit that is provided in parallel with the inductor, and is located between the ground and the parallel-arm resonators in the ladder filter, a resonance frequency of the resonance circuit being expressed as: $2f0-150$ MHz$<fr<2f0+150$ MHz or $3f0-150$ MHz$<fr<3f0+150$ MHz where fr represents the resonance frequency, and f0 represents the passband frequency of the ladder filter. The resonance circuit may have an attenuation pole at the frequency equivalent to the second harmonic wave or the third harmonic wave of the passband frequency, and is series-connected between a parallel-arm resonator and the ground. The acoustic wave filter thus configured is capable of restricting a decrease in attenuation in the vicinity of the passband and can increase the attenuation at the high frequency equivalent to the second harmonic wave or the third harmonic wave of the passband frequency.

The acoustic wave filter may have two resonator circuits, wherein the resonance frequency fr of one of the two resonator circuits is expressed as $2f0-150$ MHz$<fr<2f0+150$ MHz while the resonance frequency fr of the other one of the two resonator circuits is expressed as $3f0-150$ MHz$<fr<3f0+150$ MHz. It is thus possible to provide an acoustic wave filter that can increase the attenuation at the high frequencies equivalent to the second harmonic wave and the third harmonic wave of the passband frequency.

The resonance circuit may include a capacitor and an inductor and can be readily formed with a capacitor and an inductor.

At least one of the capacitor and the inductor of the resonance circuit may be of a lumped constant type, formed on a chip. Thus, a high inductance and capacitance can be formed with high precision, and the mounting area can be made smaller.

At least one of the capacitor and the inductor of the resonance circuit may be an individual component. The capacitor of the resonance circuit may be formed with an acoustic wave resonator formed on a chip on which the ladder filter is formed. The inductor of the resonance circuit may be a ground line pattern that is formed on a chip on which the ladder filter is formed. The acoustic wave resonators forming the ladder filter may be surface acoustic wave resonators or film bulk acoustic resonators.

According to another aspect of the present invention, there is provided an acoustic wave duplexer comprising: a transmission filter that is formed with an acoustic wave filter and is connected to an antenna terminal and a transmission terminal; a reception filter that is connected to the antenna terminal and a reception terminal; and a matching circuit that is provided between the antenna terminal and the transmission filter, between the antenna terminal and the reception filter, or between the antenna terminal and both the transmission filter and the reception filter, wherein the acoustic wave filter is configured as described above. It is thus possible to provide an acoustic wave duplexer that can restrict a decrease in attenuation in the frequency band of reception signals and can increase the attenuation at the high frequency equivalent to the second harmonic wave or the third harmonic wave of transmission signals.

The resonance circuit and the matching circuit may be formed on the same chip so as to reduce the mounting area.

As described above, the present invention can provide an acoustic wave filter and an acoustic wave duplexer that can restrain a decrease in attenuation in the vicinity of the passband and can increase the attenuation at high frequencies.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An acoustic wave filter comprising:
   a ladder filter that has acoustic wave resonators connected in series and parallel arms;
   an inductor that is provided between a ground and at least one of the parallel-arm resonators in the ladder filter; and
   a resonance circuit that is provided in parallel with the inductor, and is located between the ground and the parallel-arm resonators in the ladder filter,
   a resonance frequency of the resonance circuit being expressed as:

$2f0-150 \text{ MHz} < fr < 2f0+150 \text{ MHz}$ or $3f0-150 \text{ MHz} < fr < 3f0+150 \text{ MHz}$ where fr represents the resonance frequency, and f0 represents the passband frequency of the ladder filter.

2. The acoustic wave filter as claimed in claim 1, comprising two resonance circuits,
   wherein the resonance frequency fr of one of the two resonance circuits is expressed as $2f0-150 \text{ MHz} < fr < 2f0+150 \text{ MHz}$ while the resonance frequency fr of the other one of the two resonance circuits is expressed as $3f0-150 \text{ MHz} < fr < 3f0+150 \text{ MHz}$.

3. The acoustic wave filter as claimed in claim 1, wherein the resonance circuit includes a capacitor and an inductor.

4. The acoustic wave filter as claimed in claim 3, wherein at least one of the capacitor and the inductor of the resonance circuit is of a lumped constant type, formed on a chip.

5. The acoustic wave filter as claimed in claim 3, wherein at least one of the capacitor and the inductor of the resonance circuit is an individual component.

6. The acoustic wave filter as claimed in claim 3, wherein the capacitor of the resonance circuit is formed with an acoustic wave resonator formed on a chip on which the ladder filter is formed.

7. The acoustic wave filter as claimed in claim 3, wherein the inductor of the resonance circuit is a ground line pattern that is formed on a chip on which the ladder filter is formed.

8. The acoustic wave filter as claimed in claim 1, wherein the acoustic wave resonators forming the ladder filter are surface acoustic wave resonators or film bulk acoustic resonators.

9. An acoustic wave duplexer comprising:
   a transmission filter that is formed with an acoustic wave filter and is connected to an antenna terminal and a transmission terminal;
   a reception filter that is connected to the antenna terminal and a reception terminal; and
   a matching circuit that is provided between the antenna terminal and the transmission filter, between the antenna terminal and the reception filter, or between the antenna terminal and both the transmission filter and the reception filter,
   the acoustic wave filter including:
   a ladder filter that has acoustic wave resonators connected in series and parallel arms;
   an inductor that is provided between a ground and at least one of the parallel-arm resonators in the ladder filter; and
   a resonance circuit that is provided in parallel with the inductor, and is located between the ground and the parallel-arm resonators in the ladder filter,
   a resonance frequency of the resonance circuit being expressed as:

$2f0-150 \text{ MHz} < fr < 2f0+150 \text{ MHz}$ or $3f0-150 \text{ MHz} < fr < 3f0+150 \text{ MHz}$ where fr represents the resonance frequency, and f0 represents the passband frequency of the ladder filter.

10. The acoustic wave duplexer as claimed in claim 9, wherein the matching circuit is formed on a chip on which at least one of an inductor and a capacitor of the resonance circuit provided in the transmission filter is formed.

* * * * *